(12) United States Patent
Liu et al.

(10) Patent No.: US 8,951,429 B1
(45) Date of Patent: Feb. 10, 2015

(54) TUNGSTEN OXIDE PROCESSING

(71) Applicant: Applied Materials, Inc., Santa Clara, CA (US)

(72) Inventors: Jie Liu, Sunnyvale, CA (US); Xikun Wang, Sunnyvale, CA (US); Seung Park, Pleasanton, CA (US); Mikhail Korolik, San Jose, CA (US); Anchuan Wang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/136,200

(22) Filed: Dec. 20, 2013

Related U.S. Application Data

(60) Provisional application No. 61/896,741, filed on Oct. 29, 2013.

(51) Int. Cl.
| | |
|---|---|
| *B44C 1/22* | (2006.01) |
| *C23F 1/00* | (2006.01) |
| *C23F 3/00* | (2006.01) |
| *H01J 37/32* | (2006.01) |

(52) U.S. Cl.
CPC ..... *H01J 37/32449* (2013.01); *H01J 37/32082* (2013.01); *H01J 37/32357* (2013.01)
USPC ................................ 216/76; 216/67; 438/722

(58) Field of Classification Search
USPC ........................................ 216/67, 76; 438/722
See application file for complete search history.

(56) References Cited

U.S. PATENT DOCUMENTS

| | | | |
|---|---|---|---|
| 2,369,620 | A | 2/1945 | Sullivan et al. |
| 3,451,840 | A | 6/1969 | Hough |

(Continued)

FOREIGN PATENT DOCUMENTS

| | | |
|---|---|---|
| CN | 1375575 | 10/2002 |
| CN | 1412861 A | 4/2003 |

(Continued)

OTHER PUBLICATIONS

C.K. Hu, et al. "Reduced Electromigration of Cu Wires by Surface Coating" Applied Physics Letters, vol. 81, No. 10, Sep. 2, 2002—pp. 1782-1784.

(Continued)

*Primary Examiner* — Roberts Culbert
(74) *Attorney, Agent, or Firm* — Kilpatrick Townsend & Stockton LLP

(57) ABSTRACT

Methods of selectively etching tungsten oxide relative to tungsten, silicon oxide, silicon nitride and/or titanium nitride are described. The methods include a remote plasma etch using plasma effluents formed from a fluorine-containing precursor in combination with ammonia ($NH_3$). Plasma effluents from the remote plasma are flowed into a substrate processing region where the plasma effluents react with the tungsten oxide. The plasmas effluents react with exposed surfaces and selectively remove tungsten oxide while very slowly removing other exposed materials. Increasing a flow of ammonia during the process removes a typical skin of tungsten oxide having higher oxidation coordination number first and then selectively etching lower oxidation tungsten oxide. In some embodiments, the tungsten oxide etch selectivity results partly from the presence of an ion suppression element positioned between the remote plasma and the substrate processing region.

15 Claims, 5 Drawing Sheets

(56) References Cited

U.S. PATENT DOCUMENTS

| | | |
|---|---|---|
| 3,937,857 A | 2/1976 | Brummett et al. |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,625,678 A | 12/1986 | Shioya et al. |
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,749,440 A | 6/1988 | Blackwood et al. |
| 4,753,898 A | 6/1988 | Parrillo et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,851,370 A | 7/1989 | Doklan et al. |
| 4,865,685 A | 9/1989 | Palmour |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,994,404 A | 2/1991 | Sheng et al. |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,186,718 A | 2/1993 | Tepman et al. |
| 5,198,034 A | 3/1993 | deBoer et al. |
| 5,203,911 A | 4/1993 | Sricharoenchaikit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,334,552 A | 8/1994 | Homma |
| 5,345,999 A | 9/1994 | Hosokawa |
| 5,352,636 A | 10/1994 | Beinglass |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,529 A | 3/1995 | Homma |
| 5,403,434 A | 4/1995 | Moslehi |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,571,576 A | 11/1996 | Qian et al. |
| 5,578,130 A | 11/1996 | Hayashi et al. |
| 5,591,269 A | 1/1997 | Arami et al. |
| 5,599,740 A | 2/1997 | Jang et al. |
| 5,624,582 A | 4/1997 | Cain |
| 5,626,922 A | 5/1997 | Miyanaga et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,679,606 A | 10/1997 | Wang et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,402 A | 5/1998 | Jimbo et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,838,055 A | 11/1998 | Kleinhenz et al. |
| 5,843,538 A | 12/1998 | Ehrsam et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |

(56) References Cited

U.S. PATENT DOCUMENTS

| | | |
|---|---|---|
| 5,872,058 A | 2/1999 | Van Cleemput et al. |
| 5,882,786 A | 3/1999 | Nassau et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,920,792 A | 7/1999 | Lin |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,086,677 A | 7/2000 | Umotoy et al. |
| 6,087,278 A | 7/2000 | Kim et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,812 B1 | 1/2001 | Hsuing et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,752 B1 | 8/2001 | Chen |
| 6,277,763 B1 | 8/2001 | Kugimiya et al. |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,418 B1 | 10/2001 | Cha et al. |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| 6,344,410 B1 | 2/2002 | Lopatin et al. |
| 6,350,320 B1 | 2/2002 | Sherstinsky et al. |
| 6,351,013 B1 | 2/2002 | Luning et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,379,575 B1 | 4/2002 | Yin et al. |
| 6,383,951 B1 | 5/2002 | Li |
| 6,387,207 B1 | 5/2002 | Janakiraman et al. |
| 6,395,150 B1 | 5/2002 | Van Cleemput et al. |
| 6,403,491 B1 | 6/2002 | Liu et al. |
| 6,416,647 B1 | 7/2002 | Dordi et al. |
| 6,432,819 B1 | 8/2002 | Pavate et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,500,728 B1 | 12/2002 | Wang |
| 6,503,843 B1 | 1/2003 | Xia et al. |

(56) References Cited

U.S. PATENT DOCUMENTS

| | | |
|---|---|---|
| 6,506,291 B2 | 1/2003 | Tsai et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty |
| 6,645,550 B1 | 11/2003 | Cheung et al. |
| 6,656,831 B1 | 12/2003 | Lee et al. |
| 6,656,837 B2 | 12/2003 | Xu et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,858,153 B2 | 2/2005 | Bjorkman et al. |
| 6,867,141 B2 | 3/2005 | Jung et al. |
| 6,869,880 B2 | 3/2005 | Krishnaraj et al. |
| 6,878,206 B2 | 4/2005 | Tzu et al. |
| 6,879,981 B2 | 4/2005 | Rothschild et al. |
| 6,893,967 B1 | 5/2005 | Wright et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 7,017,269 B2 | 3/2006 | White et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,390,710 B2 | 6/2008 | Derderian et al. |
| 7,396,480 B2 | 7/2008 | Kao et al. |
| 7,465,358 B2 | 12/2008 | Weidman et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,083,853 B2 | 12/2011 | Choi et al. |
| 8,187,486 B1 | 5/2012 | Liu et al. |
| 8,211,808 B2 | 7/2012 | Sapre et al. |
| 8,309,440 B2 | 11/2012 | Sanchez et al. |
| 8,328,939 B2 | 12/2012 | Choi et al. |
| 8,435,902 B2 | 5/2013 | Tang et al. |
| 8,491,805 B2 | 7/2013 | Kushibiki et al. |
| 8,642,481 B2 | 2/2014 | Wang et al. |
| 2001/0008803 A1 | 7/2001 | Takamatsu et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2001/0055842 A1 | 12/2001 | Uh et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0098681 A1 | 7/2002 | Hu et al. |
| 2002/0124867 A1 | 9/2002 | Kim et al. |
| 2002/0177322 A1 | 11/2002 | Li et al. |
| 2002/0187655 A1 | 12/2002 | Tan et al. |
| 2002/0197823 A1 | 12/2002 | Yoo et al. |
| 2003/0010645 A1 | 1/2003 | Ting et al. |
| 2003/0019428 A1 | 1/2003 | Ku et al. |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0072639 A1 | 4/2003 | White et al. |
| 2003/0075808 A1 | 4/2003 | Inoue et al. |

(56) References Cited

U.S. PATENT DOCUMENTS

| | | |
|---|---|---|
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0033678 A1 | 2/2004 | Arghavani et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0266622 A1 | 12/2005 | Arghavani et al. |
| 2005/0266691 A1 | 12/2005 | Gu et al. |
| 2005/0287771 A1 | 12/2005 | Seamons et al. |
| 2006/0000805 A1 | 1/2006 | Todorow et al. |
| 2006/0019456 A1 | 1/2006 | Bu et al. |
| 2006/0019486 A1 | 1/2006 | Yu et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0093756 A1 | 5/2006 | Rajagopalan et al. |
| 2006/0102076 A1 | 5/2006 | Smith et al. |
| 2006/0130971 A1 | 6/2006 | Chang et al. |
| 2006/0166107 A1 | 7/2006 | Chen et al. |
| 2006/0166515 A1 | 7/2006 | Karim et al. |
| 2006/0185592 A1 | 8/2006 | Matsuura |
| 2006/0207504 A1 | 9/2006 | Hasebe et al. |
| 2006/0211260 A1 | 9/2006 | Tran et al. |
| 2006/0216923 A1 | 9/2006 | Tran et al. |
| 2006/0226121 A1 | 10/2006 | Aoi |
| 2006/0240661 A1 | 10/2006 | Annapragada et al. |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0261490 A1 | 11/2006 | Su et al. |
| 2006/0264003 A1 | 11/2006 | Eun |
| 2006/0264043 A1 | 11/2006 | Stewart et al. |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0123051 A1 | 5/2007 | Arghavani et al. |
| 2007/0181057 A1 | 8/2007 | Lam et al. |
| 2007/0197028 A1 | 8/2007 | Byun et al. |
| 2007/0232071 A1 | 10/2007 | Balseanu et al. |
| 2007/0238321 A1 | 10/2007 | Futase et al. |
| 2007/0269976 A1 | 11/2007 | Futase et al. |
| 2007/0281106 A1 | 12/2007 | Lubomirsky et al. |
| 2008/0044990 A1 | 2/2008 | Lee |
| 2008/0081483 A1 | 4/2008 | Wu |
| 2008/0085604 A1 | 4/2008 | Hoshino et al. |
| 2008/0099431 A1 | 5/2008 | Kumar et al. |
| 2008/0115726 A1 | 5/2008 | Ingle et al. |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0160210 A1 | 7/2008 | Yang et al. |
| 2008/0162781 A1 | 7/2008 | Haller et al. |
| 2008/0182381 A1 | 7/2008 | Kiyotoshi |
| 2008/0182382 A1 | 7/2008 | Ingle et al. |
| 2008/0230519 A1 | 9/2008 | Takahashi |
| 2008/0233709 A1 | 9/2008 | Conti et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2009/0004849 A1 | 1/2009 | Eun |
| 2009/0017227 A1 | 1/2009 | Fu et al. |
| 2009/0045167 A1 | 2/2009 | Maruyama |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0189246 A1 | 7/2009 | Wu et al. |
| 2009/0255902 A1 | 10/2009 | Satoh et al. |
| 2009/0275205 A1 | 11/2009 | Kiehlbauch et al. |
| 2009/0275206 A1 | 11/2009 | Katz et al. |
| 2009/0280650 A1 | 11/2009 | Lubomirsky et al. |
| 2010/0059889 A1 | 3/2010 | Gosset et al. |
| 2010/0075503 A1 | 3/2010 | Bencher et al. |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0105209 A1 | 4/2010 | Winniczek et al. |
| 2010/0144140 A1 | 6/2010 | Chandrashekar et al. |
| 2010/0173499 A1 | 7/2010 | Tao et al. |
| 2010/0187534 A1 | 7/2010 | Nishi et al. |
| 2010/0187588 A1 | 7/2010 | Kim et al. |
| 2010/0330814 A1 | 12/2010 | Yokota et al. |
| 2011/0008950 A1 | 1/2011 | Xu |
| 2011/0034035 A1 | 2/2011 | Liang et al. |
| 2011/0053380 A1 | 3/2011 | Sapre et al. |
| 2011/0081782 A1 | 4/2011 | Liang et al. |
| 2011/0143542 A1 | 6/2011 | Feurprier et al. |
| 2011/0151674 A1 | 6/2011 | Tang et al. |

(56) References Cited

U.S. PATENT DOCUMENTS

| | | |
|---|---|---|
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0159690 A1 | 6/2011 | Chandrashekar et al. |
| 2011/0165771 A1 | 7/2011 | Ring et al. |
| 2011/0195575 A1 | 8/2011 | Wang |
| 2011/0226734 A1 | 9/2011 | Sumiya et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0003782 A1 | 1/2012 | Byun et al. |
| 2012/0009796 A1 | 1/2012 | Cui et al. |
| 2012/0068242 A1 | 3/2012 | Shin et al. |
| 2012/0135576 A1 | 5/2012 | Lee et al. |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0089988 A1 | 4/2013 | Wang et al. |
| 2013/0119483 A1 | 5/2013 | Alptekin et al. |
| 2013/0260533 A1 | 10/2013 | Sapre et al. |

FOREIGN PATENT DOCUMENTS

| | | | |
|---|---|---|---|
| CN | 101465386 A | | 6/2009 |
| EP | 0329406 | | 8/1989 |
| EP | 0376252 | A2 | 7/1990 |
| EP | 0475567 | | 3/1992 |
| EP | 0 496 543 | A2 | 7/1992 |
| EP | 0 658 928 | A1 | 6/1995 |
| EP | 0697467 | A1 | 2/1996 |
| EP | 0913498 | | 5/1999 |
| EP | 1099776 | | 5/2001 |
| EP | 1107288 | | 6/2001 |
| EP | 1496542 | | 1/2005 |
| EP | 1568797 | | 8/2005 |
| GB | 2285174 | | 6/1995 |
| JP | 61-276977 | A | 12/1986 |
| JP | 2058836 | A | 2/1990 |
| JP | 02-121330 | A | 5/1990 |
| JP | 02256235 | | 10/1990 |
| JP | 4-239750 | | 7/1992 |
| JP | 4-341568 | A | 11/1992 |
| JP | 07-130713 | A | 5/1995 |
| JP | 7-161703 | A | 6/1995 |
| JP | 7297543 | | 11/1995 |
| JP | 08-306671 | A | 11/1996 |
| JP | 09153481 | A | 6/1997 |
| JP | 09-205140 | A | 8/1997 |
| JP | 10-178004 | A | 6/1998 |
| JP | 2010-154699 | | 6/1998 |
| JP | 11124682 | | 5/1999 |
| JP | H11-204442 | | 7/1999 |
| JP | 2000-012514 | A | 1/2000 |
| JP | 2001-308023 | | 11/2001 |
| JP | 2002-100578 | | 4/2002 |
| JP | 2002-141349 | | 5/2002 |
| JP | 2002-222861 | A | 8/2002 |
| JP | 2002-256235 | | 9/2002 |
| JP | 2003-019433 | | 1/2003 |
| JP | 2003-059914 | | 2/2003 |
| JP | 2003-179038 | A | 6/2003 |
| JP | 2003-217898 | | 7/2003 |
| JP | 2003-318158 | A | 11/2003 |
| JP | 2003-347278 | A | 12/2003 |
| JP | 2004-047956 | A | 2/2004 |
| JP | 2004-156143 | A | 6/2004 |
| JP | 04-239723 | | 8/2004 |
| JP | 2005-033023 | A | 2/2005 |
| JP | 2007-173383 | | 7/2007 |
| JP | 08-148470 | A | 6/2008 |
| KR | 10-0155601 | B1 | 12/1998 |
| KR | 10-0236219 | B1 | 12/1999 |
| KR | 1020000008278 | A | 2/2000 |
| KR | 2000-0044928 | | 7/2000 |
| KR | 2001-0014064 | A | 2/2001 |
| KR | 10-2001-0049274 | A | 6/2001 |
| KR | 10-2001-0058774 | A | 7/2001 |
| KR | 10-2001-0082109 | | 8/2001 |
| KR | 1020030081177 | | 10/2003 |
| KR | 10-2004-0049739 | A | 6/2004 |
| KR | 10-2004-0096365 | A | 11/2004 |
| KR | 1020050042701 | A | 5/2005 |
| KR | 10-0681390 | | 9/2006 |
| KR | 1020080063988 | A | 7/2008 |
| KR | 10-2010-0013980 | A | 2/2010 |
| KR | 10-2010-0074508 | A | 7/2010 |
| KR | 10-1050454 | B1 | 7/2011 |
| KR | 1020110126675 | A | 11/2011 |
| KR | 1020120082640 | A | 7/2012 |
| WO | 92/20833 | A1 | 11/1992 |
| WO | 99/26277 | A1 | 5/1999 |
| WO | 99/54920 | A2 | 10/1999 |
| WO | 9954920 | A2 | 10/1999 |
| WO | 99/62108 | A2 | 12/1999 |
| WO | 00/13225 | A1 | 3/2000 |
| WO | 00/22671 | | 4/2000 |
| WO | 0022671 | | 4/2000 |
| WO | 01/94719 | A1 | 12/2001 |
| WO | 02083981 | A2 | 10/2002 |
| WO | 03014416 | | 2/2003 |
| WO | 2004/006303 | | 1/2004 |
| WO | 2004/074932 | | 9/2004 |
| WO | 2004/114366 | A2 | 12/2004 |
| WO | 2005036615 | A2 | 4/2005 |
| WO | 2006/069085 | A2 | 6/2006 |
| WO | 2009/071627 | A2 | 6/2009 |
| WO | 2011/087580 | A1 | 7/2011 |
| WO | 2011/115761 | A2 | 9/2011 |
| WO | 2011/139435 | A2 | 11/2011 |
| WO | 2012/018449 | A2 | 2/2012 |
| WO | 2012/125654 | A2 | 9/2012 |

OTHER PUBLICATIONS

European Search Report dated May 23, 2006 for EP Application No. 05251143.3.

European Examination Report dated Nov. 13, 2007 for EP Application No. 05251143.3.

EP Partial Search Report, Application No. 08150111.601235/1944796, dated Aug. 22, 2008.

Eze, F. C., "Electroless deposition of CoO thin films," J. Phys. D: Appl. Phys. 32 (1999), pp. 533-540.

Galiano et al. "Stress-Temperature Behavior of Oxide Films Used for Intermetal Dielectric Applications", VMIC Conference, Jun. 9-10, 1992, pp. 100-106.

Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.

International Search Report of PCT/US2009/059743 mailed on Apr. 26, 2010, 4 pages.

International Search Report of PCT/US2012/061726 mailed on May 16, 2013, 3 pages.

International Search Report of PCT/2013/052039 mailed on Nov. 8, 2013, 9 pages.

International Search Report of PCT/2013/037202 mailed on Aug. 23, 2013, 11 pages.

Lin, et al., "Manufacturing of Cu Electroless Nickel/Sn—Pb Flip Chip Solder Bumps", IEEE Transactions on Advanced Packaging, vol. 22, No. 4 (Nov. 1999), pp. 575-579.

Lopatin, et al., "Thin Electroless barrier for copper films", Part of the SPIE Conference of Multilevel Interconnect technology II, SPIE vol. 3508 (1998), pp. 65-77.

(56) References Cited

OTHER PUBLICATIONS

Musaka, "Single Step Gap Filling Technology fo Subhalf Micron Metal Spacings on Plasma Enhanced TEOS/$O_2$ Chemical Vapor Deposition System," Extended Abstracts of the 1993 International Conference on Solid State Devices and Materials pages, 1993, 510-512.

Pearlstein, Fred. "Electroless Plating," J. Res. Natl. Bur. Stan., Ch. 31 (1974), pp. 710-747.

Saito, et al., "Electroless deposition of Ni—B, Co—B and Ni—Co—B alloys using dimethylamineborane as a reducing agent," Journal of Applied Electrochemistry 28 (1998), pp. 559-563.

Schacham-Diamond, et al., "Electrochemically deposited thin film alloys for ULSI and MEMS applications," Microelectronic Engineering 50 (2000), pp. 525-531.

Schacham-Diamond, et al. "Material properties of electroless 100-200 nm thick CoWP films," Electrochemical Society Proceedings, vol. 99-34, pp. 102-110.

Smayling, et al., "APF® Pitch-Halving for 2nm Logic Cells using Gridded Design Rules", proceedings of the SPIE, 2008, 8 pages.

Vassiliev, et al., "Trends in void-free pre-metal CVD dielectrics," Solid State Technology, Mar. 2001, pp. 129-136.

Weston, et al., "Ammonium Compounds," Kirk-Othmer Encyclopedia of Chemical Technology, 2003,30 pages see pp. 717-718, John Wiley & Sons, Inc.

Yosi Shacham-Diamond, et al. "High Aspect Ratio Quarter-Micron Electroless Copper Integrated Technology", Microelectronic Engineering 37/38 (1997) pp. 77-88.

Abraham, "Reactive Facet Tapering of Plasma Oxide for Multilevel Interconnect Applications", IEEE, V-MIC Conference, Jun. 15-16, 1987, pp. 115-121.

Applied Materials, Inc., "Applied Siconi™ Preclean," printed on Aug. 7, 2009, 8 pages.

Carlson, et al., "A Negative Spacer Lithography Process for Sub-100nm Contact Holes and Vias", University of California at Berkeley, Jun. 19, 2007, 4 pp.

Chang et al. "Frequency Effects and Properties of Plasma Deposited Fluorinated Silicon Nitride", J. Vac Sci Technol B 6(2), Mar./Apr. 1988, pp. 524-532.

Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.

Examination Report dated Jun. 28, 2010 for European Patent Application No. 05251143.3.

Fukada et al., "Preparation of SiOF Films with Low Dielectric Constant by ECR Plasma CVD," ISMIC, DUMIC Conference, Feb. 21-22, 1995, pp. 43-49.

Hashim et al., "Characterization of thin oxide removal by RTA Treatment," ICSE 1998 Proc. Nov. 1998, Rangi, Malaysia, pp. 213-216.

Hausmann, et al., "Rapid Vapor Deposition of Highly Conformal Silica Nanolaminates," Science, Oct. 11, 2002, p. 402-406, vol. 298.

Hayasaka, N. et al. "High Quality Low Dielectric Constant SiO2 CVD Using High Density Plasma," Proceedings of the Dry Process Symposium, 1993, pp. 163-168.

Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.

International Search Report and Written Opinion of the International Searching Authority mailed Jul. 3, 2008 (PCT/US05/46226).

International Search Report and Written Opinion for PCT Application No. PCT/US2011/027221, mailed on Nov. 1, 2011, 8 pages.

International Search Report and Written Opinion of PCT/US2010/057676 mailed on Jun. 27, 2011, 9 pages.

International Search Report and Written Opinion of PCT/US2011/030582 mailed Dec. 7, 2011, 9 pages.

International Search Report and Written Opinion of PCT/US2011/064724 mailed on Oct. 12, 2012, 8 pages.

International Search Report and Written Opinion of PCT/US2012/028952 mailed on Oct. 29, 2012, 9 pages.

International Search Report and Written Opinion of PCT/US2012/048842 mailed on Nov. 28, 2012, 10 pages.

International Search Report and Written Opinion of PCT/US2012/053329 mailed on Feb. 15, 2013, 8 pages.

International Search Report and Written Opinion of PCT/US2012/057294 mailed on Mar. 18, 2013, 12 pages.

International Search Report and Written Opinion of PCT/US2012/057358 mailed on Mar. 25, 2013, 10 pages.

International Search Report and Written Opinion of PCT/US2012/058818 mailed on Apr. 1, 2013, 9 pages.

International Search Report and Written Opinion of the International Searching Authority for PCT Application No. PCT/US2012/028957, mailed on Oct. 18, 2012, 9 pages.

International Search report and Written Opinion of PCT/CN2010/000932 dated Mar. 31, 2011, 8 pages.

Japanese Patent Office, Official Action for Application No. 2007-317207 mailed on Dec. 21, 2011, 2 pages.

International Search Report and Written Opinion of PCT/US2013/076217 mailed on Apr. 28, 2014, 11 pages.

Jung, et al., "Patterning with amorphous carbon spacer for expanding the resolution limit of current lithography tool", Proc. SPIE , 2007, 9 pages, vol. 6520, 65201C.

Laxman, "Low ε Dielectrics: CVD Fluorinated Silicon Dioxides", Semiconductor International, May 1995, pp. 71-74.

Lee, et al., "Dielectric Planarization Techniques for Narrow Pitch Multilevel Interconnects," IEEE, V-MIC Conference Jun. 15-16, 1987, pp. 85-92 (1987).

Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.

Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).

Mukai, et al., "A Study of CD Budget in Spacer Patterning Process", Toshiba, SPIE 2008, Feb. 26, 2008, 12 pages.

Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.

Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.

Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.

Qian, et al., "High Density Plasma Deposition and Deep Submicron Gap Fill with Low Dielectric Constant SiOF Films," ISMIC, DUMIC Conference Feb. 21-22, 1995, pp. 50-56.

Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.

Shapiro, et al. "Dual Frequency Plasma CVD Fluorosilicate Glass: Water Absorption and Stability", ISMIC, DUMIC Conference Feb. 21-22, 1995, pp. 118-123.

S.M. Sze, VLSI Technology, McGraw-Hill Book Company, pp. 107, 108.

C.C. Tang and D. W. Hess, Tungsten Etching in CF4 and SF6 Discharges, J. Electrochem. Soc., 1984, 131 (1984) p. 115-120.

Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.

Wang et al.; Ultra High-selectivity silicon nitride etch process using an inductively coupled plasma source; J. Vac. Sci. Technol. A 16(3),May/Jun. 1998, pp. 1582-1587.

Wolf et al.; Silicon Processing for the VLSI Era; vol. 1; 1986; Lattice Press, pp. 546, 547, 618, 619.

Yu, et al., "Step Coverage Study of Peteos Deposition for Intermetal Dielectric Applications," abstract, VMIC conference, Jun. 12-13, 1990, 7 pages, No. 82.

Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

TUNGSTEN OXIDE PROCESSING

CROSS-REFERENCES TO RELATED APPLICATIONS

This application claims the benefit of U.S. Prov. Pat. App. No. 61/896,741 filed Oct. 29, 2013, and titled "TUNGSTEN OXIDE PROCESSING" by Liu et al., which is hereby incorporated herein in its entirety by reference for all purposes.

FIELD

Embodiments of the invention relate to cleaning and selectively etching tungsten oxide.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective of the first material. As a result of the diversity of materials, circuits and processes, etch processes have been developed that selectively remove one or more of a broad range of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have recently been developed to selectively remove a variety of dielectrics relative to one another. However, fewer dry-etch processes have been developed to selectively remove metal oxides.

Methods are needed to selectively etch metal oxides using dry etch processes.

SUMMARY

Methods of selectively etching tungsten oxide relative to tungsten, silicon oxide, silicon nitride and/or titanium nitride are described. The methods include a remote plasma etch using plasma effluents formed from a fluorine-containing precursor in combination with ammonia ($NH_3$). Plasma effluents from the remote plasma are flowed into a substrate processing region where the plasma effluents react with the tungsten oxide. The plasmas effluents react with exposed surfaces and selectively remove tungsten oxide while very slowly removing other exposed materials. Increasing a flow of ammonia during the process removes a typical skin of tungsten oxide having higher oxidation coordination number first and then selectively etching lower oxidation tungsten oxide. In some embodiments, the tungsten oxide etch selectivity results partly from the presence of an ion suppression element positioned between the remote plasma and the substrate processing region.

Embodiments include methods of etching tungsten oxide. The methods include flowing a fluorine-containing precursor and ammonia ($NH_3$) into a remote plasma region fluidly coupled to a substrate processing region via through-holes in a showerhead while forming a remote plasma in the remote plasma region to produce plasma effluents. The methods further include etching the tungsten oxide from a substrate disposed within the substrate processing region by flowing the plasma effluents into the substrate processing region through the through-holes in the showerhead.

Embodiments include methods of etching tungsten oxide. The methods include flowing a fluorine-containing precursor and ammonia ($NH_3$) into a remote plasma region fluidly coupled to a substrate processing region via through-holes in a showerhead. The fluorine-containing precursor and the ammonia are flowed at a first flow rate ratio (ammonia:fluorine-containing precursor). The methods further include forming a remote plasma in the remote plasma region to produce plasma effluents from the fluorine-containing precursor and the ammonia ($NH_3$). The methods further include etching a first portion of the tungsten oxide from a substrate disposed within the substrate processing region by flowing the plasma effluents into the substrate processing region through the through-holes in the showerhead. The methods further include increasing flow rate ratio (ammonia:fluorine-containing precursor) to a second flow rate ratio which is greater than the first flow rate ratio. The methods further include etching a second portion of the tungsten oxide from the substrate by continuing to flow plasma effluents into the substrate processing region.

Embodiments include methods of etching tungsten oxide. The methods further include flowing nitrogen trifluoride ($NF_3$) at a nitrogen trifluoride flow rate and ammonia ($NH_3$) at a first ammonia flow rate into a remote plasma region fluidly coupled to a substrate processing region via through-holes in a showerhead. The methods further include forming a remote plasma in the remote plasma region to produce plasma effluents from the nitrogen trifluoride and the ammonia. The methods further include etching a first portion of the tungsten oxide from a substrate disposed within the substrate processing region by flowing the plasma effluents into the substrate processing region through the through-holes in the showerhead. The methods further include increasing the flow rate of the ammonia from the first ammonia flow rate to a second ammonia flow rate. The methods further include etching a second portion of the tungsten oxide from the substrate by continuing to flow plasma effluents into the substrate processing region.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods of selectively etching tungsten oxide relative to tungsten, silicon oxide, silicon nitride and/or titanium nitride are described. The methods include a remote plasma etch using plasma effluents formed from a fluorine-containing precursor in combination with ammonia ($NH_3$). Plasma effluents from the remote plasma are flowed into a substrate processing region where the plasma effluents react with the tungsten oxide. The plasmas effluents react with exposed surfaces and selectively remove tungsten oxide while very slowly removing other exposed materials. Increasing a flow of ammonia during the process removes a typical skin of tungsten oxide having higher oxidation coordination number first and then selectively etching lower oxidation tungsten oxide. In some embodiments, the tungsten oxide etch selectivity results partly from the presence of an ion suppression element positioned between the remote plasma and the substrate processing region.

Figure 1:
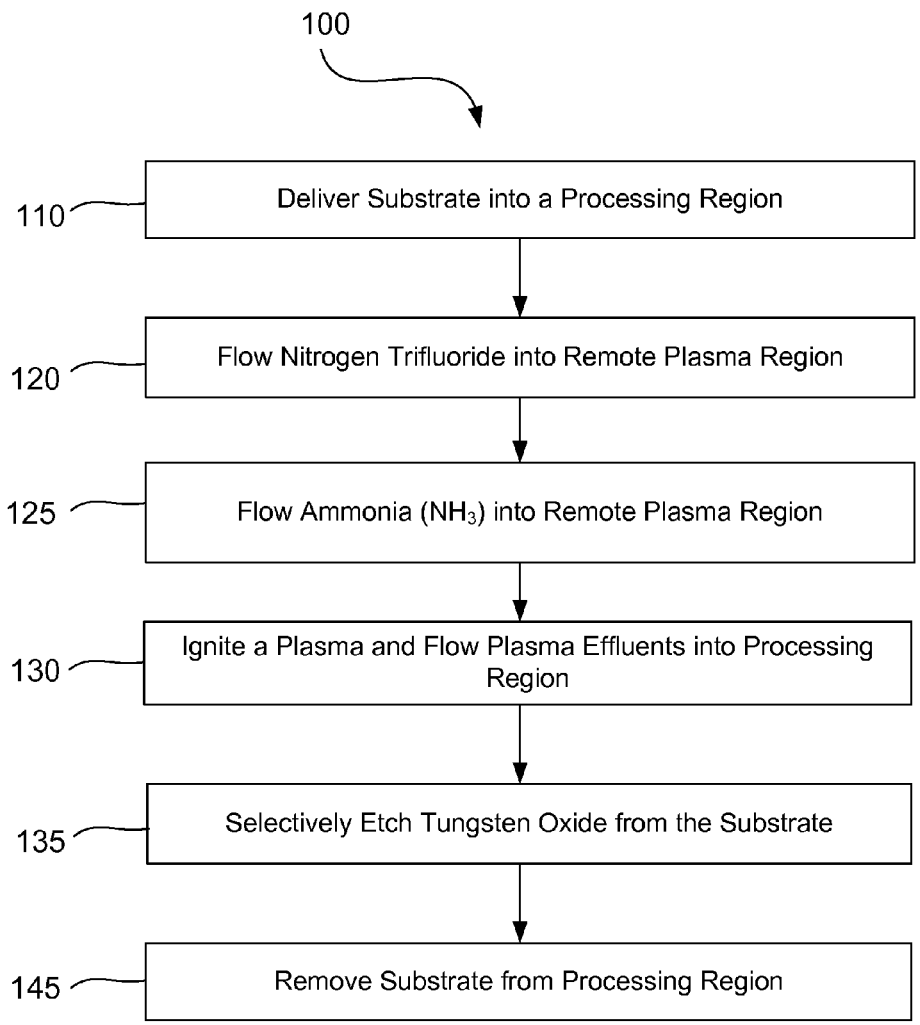
FIG. 1 is a flow chart of a tungsten oxide selective etch process according to embodiments.

In order to better understand and appreciate the invention, reference is now made to FIG. 1 which is a flow chart of a tungsten oxide selective etch process 100 according to embodiments. The tungsten oxide may have a variety of stoichiometries which may be determined by the method of forming the tungsten oxide. Prior to the first operation, tungsten oxide is formed on a substrate. The tungsten oxide may be in the form of a blanket layer on the substrate or it may reside in discrete portions of a patterned substrate surface. In either case, the tungsten oxide forms exposed surfaces of the surface of the substrate. The substrate is then delivered into a processing region (operation 110). In another embodiment, the tungsten oxide may be formed after delivering the substrate to the processing region, for example, by treating exposed portions of tungsten to a reactive oxygen source.

A flow of nitrogen trifluoride is introduced into a plasma region separate from the processing region (operation 120). Other sources of fluorine may be used to augment or replace the nitrogen trifluoride. In general, a fluorine-containing precursor may be flowed into the plasma region and the fluorine-containing precursor comprises at least one precursor selected from the group consisting of atomic fluorine, diatomic fluorine, bromine trifluoride, chlorine trifluoride, nitrogen trifluoride, hydrogen fluoride, sulfur hexafluoride and xenon difluoride. Ammonia ($NH_3$) is also flowed into the plasma region (operation 125) where it is simultaneously excited in a plasma along with the nitrogen trifluoride. The flow rate of the ammonia may be less than the flow rate of the nitrogen trifluoride (e.g. between 75% and 98% of the nitrogen trifluoride flow rate) in order to optimize the removal rate of tungsten oxide. Specific value ranges for the flow rates will be discussed shortly.

The separate plasma region may be referred to as a remote plasma region for all etch processes described herein and may be within a distinct module from the processing chamber or a compartment within the processing chamber. The separate plasma region may is fluidly coupled to the substrate processing region by through-holes in a showerhead disposed between the two regions. The hardware just described may also be used in all processes discussed herein. The remote plasma region may be a capacitively-coupled plasma region, in embodiments, and may be disposed remote from the substrate processing region of the processing chamber. For example, the capacitively-coupled plasma region (and the remote plasma region in general) may be separated from the substrate processing region by the showerhead.

The plasma effluents formed in the remote plasma region are then flowed into the substrate processing region (operation 130). Tungsten oxide on the substrate is selectively etched (operation 135) such that tungsten oxide may be removed more rapidly than a variety of other materials. The selective etch in all examples disclosed herein may etch tungsten oxide significantly faster than one or more of tungsten, silicon oxide, silicon nitride, and titanium nitride in embodiments. Such a process may have broad-based utility, but may find clear utility in removing a layer of tungsten oxidation which forms on a layer of tungsten when ashing a patterned tungsten surface to clean off photoresist residue. Etch process 100 may involve maintenance of an atomic flow ratio of fluorine (F) to hydrogen (H) in order achieve high etch selectivity of tungsten oxide. The copresence of fluorine and hydrogen is thought to enable two reactions to proceed: (1) one which consumes ammonia ($NH_3$) to convert the tungsten oxide to tungsten by shedding moisture through the exhaust system and (2) another reaction which consumes fluorine to remove tungsten in the form of exhausted tungsten hexafluoride ($WF_6$). Despite the hypothetical second reaction, tungsten oxide selective etch process 100 is highly selective of tungsten oxide over tungsten as long as the ammonia to nitrogen-trifluoride flow rate ratio is maintained as outlined herein. The reactive chemical species and any process effluents are removed from the substrate processing region and then the substrate is removed from the processing region (operation 145).

The substrate may be a patterned substrate which further includes one or more exposed regions of tungsten, silicon oxide or titanium nitride. The etch selectivity (tungsten oxide: tungsten) of the process of FIG. 1, as well as the dry etch process to be discussed with reference to FIG. 2, may be greater than or about 10:1, greater than or about 20:1, greater than or about 50:1, or greater than or about 100:1 according to embodiments. Tungsten oxide selective etch process 100 and the other tungsten oxide selective etch processes discussed herein, display etch selectivities of tungsten oxide relative to a variety of other materials. The etch selectivity of tungsten oxide relative to silicon oxide may be greater than or about 15:1, greater than or about 40:1, greater than or about 75:1 or greater than or about 150:1 according to embodiments. The etch selectivity of tungsten oxide relative to silicon nitride may be greater than or about 20:1, greater than or about 50:1, greater than or about 100:1 or greater than or about 200:1 in embodiments. The etch selectivity of tungsten oxide relative to titanium nitride may be greater than or about 20:1, greater than or about 50:1, greater than or about 100:1 or greater than or about 200:1 according to embodiments.

In each remote plasma described herein, the flows of the precursors into the remote plasma region may further include one or more relatively inert gases such as He, $N_2$, Ar. The inert gas can be used to improve plasma stability, ease plasma initiation, and improve process uniformity. Argon is helpful, as an additive, to promote the formation of a stable plasma. Process uniformity is generally increased when helium is included. These additives are present in embodiments throughout this specification. Flow rates and ratios of the different gases may be used to control etch rates and etch selectivity.

Using ammonia ($NH_3$) instead of hydrogen ($H_2$) to supply hydrogen to the remote plasma region results in a much broader process window for tungsten oxide selective etch process 100. The flow rate of the ammonia as a percentage of the flow rate of the nitrogen trifluoride may be between 75% and 100%, between 80% and 99% or preferably between 83% and 97% according to embodiments. Operating tungsten oxide selective etch processes above these ranges results in a low tungsten oxide etch rate, whereas operating the etch processes described herein below these ranges sacrifices etch selectivity compared to tungsten (i.e. the tungsten etch rate rises quickly). The preferred range for flow rate ratios spans fourteen percentage points (83%-97%), which is about a three times larger process window than when hydrogen ($H_2$) was used in place of the ammonia.

In embodiments, the fluorine-containing gas (e.g. $NF_3$) is supplied at a flow rate of between about 25 sccm (standard cubic centimeters per minute) and 400 sccm, $NH_3$ at a flow rate of between about 20 sccm and 350 sccm, He at a flow rate of between about 0 slm (standard liters per minute) and 3 slm, and Ar at a flow rate of between about 0 slm and 3 slm. Generally speaking, the fluorine-containing precursor may be supplied at a flow rate between about 25 sccm and about 400 sccm, between about 50 sccm and about 300 sccm, between about 75 sccm and about 200 sccm or between about 125 sccm and about 175 sccm according to embodiments. Ammonia ($NH_3$) may be supplied at a flow rate between about 20 sccm and about 350 sccm, between about 30 sccm and about 300 sccm, between about 50 sccm and about 200 sccm or between about 125 sccm and about 145 sccm in embodiments.

Tungsten oxide selective etch process 100 (and the other etch processes described herein) includes applying energy to the fluorine-containing precursor and the ammonia while they flow through the remote plasma region to generate the plasma effluents. The plasma may be generated using known techniques (e.g., radio frequency excitations, capacitively-coupled power, and inductively-coupled power). In an embodiment, the energy is applied using a capacitively-coupled plasma unit. The remote plasma source power may be between about 10 watts and about 2500 watts, between about 30 watts and about 2000 watts, between about 100 watts and about 1500 watts, or between about 300 watts and about 1000 watts according to embodiments. In a preferred embodiment, the remote plasma source power may be between 400 watts and 800 watts, which represents a process window of 50%. Using hydrogen ($H_2$) in place of ammonia resulted in a process window of between 30 watts and 50 watts for a process window of about 40%. In absolute terms, the process window using ammonia is 400 watts wide as opposed to 20 watts, which represents a desirable increase in process flexibility.

The pressure in the substrate processing region is about the same as the pressure in the substrate processing region, according to embodiments, in all tungsten oxide selective etch processes described herein. The pressure in the remote plasma region and also in the substrate processing region is between about 0.1 Torr and about 50 Torr, between about 0.5 Torr and about 20 Torr or preferably between about 1 Torr and about 10 Torr in embodiments. Pressures closer to the higher end of the preferred embodiment (e.g. between 5 Torr and 10 Torr) results in higher selectivities compared to the lower end of the preferred embodiment.

The temperature of the substrate during etch processes described herein may be between about 30° C. and about 300° C. in general. In embodiments, the temperature of the substrate during the etches described in this section may be greater than or about 40° C., greater than or about 60° C., greater than or about 80° C. or greater than or about 100° C. The substrate temperatures may be less than or about 250° C., less than or about 200° C., less than or about 180° C., and may be between about 100° C. and about 160° C. in embodiments.

Figure 2:
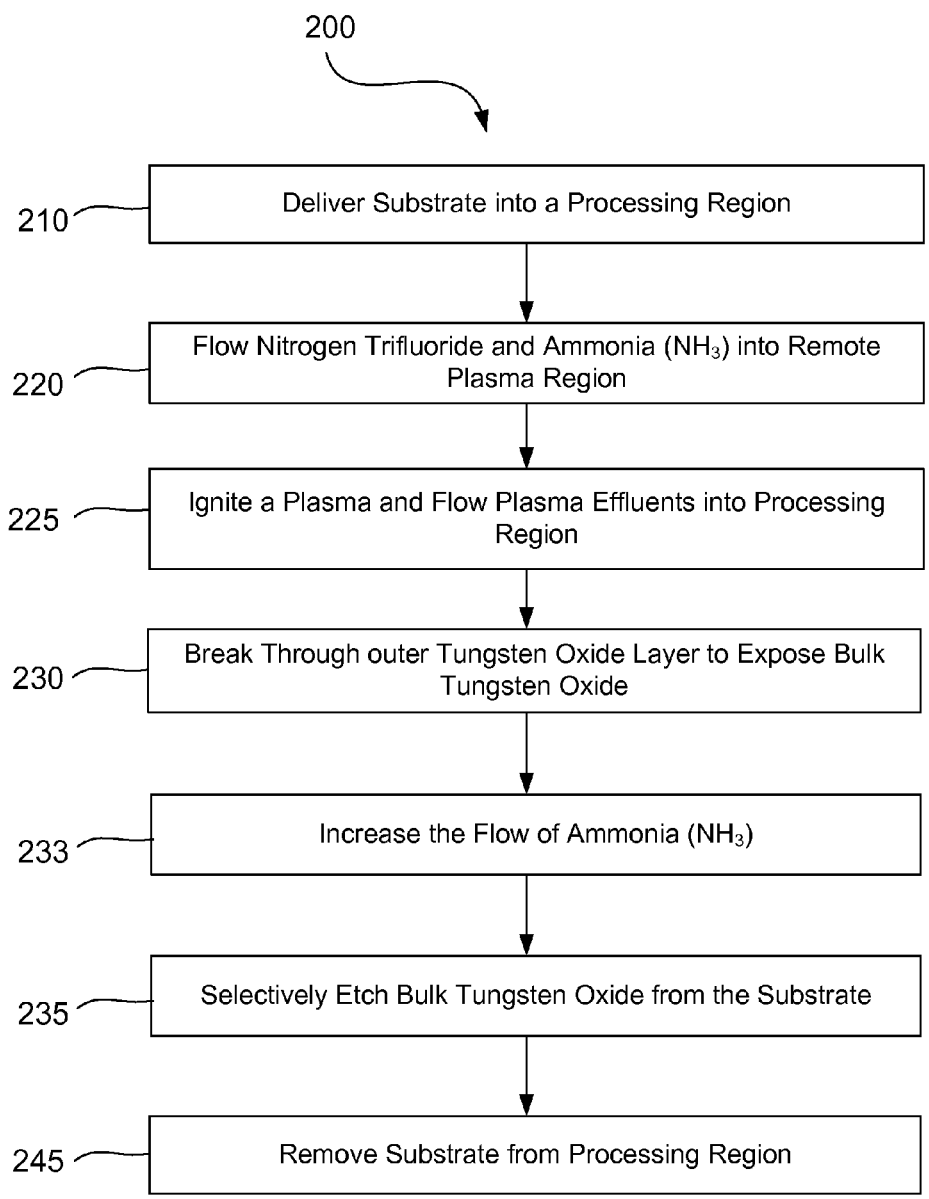
FIG. 2 is a flow chart of a tungsten oxide selective etch process according to embodiments.

In order to further appreciate the invention, reference is now made to FIG. 2 which is a flow chart of a tungsten oxide selective etch process 200 according to embodiments. The various traits and process parameters discussed with reference to FIG. 1 will not be repeated here except when they deviate from those traits and process parameters. Prior to the first operation, tungsten oxide is formed on a substrate. The substrate is then delivered into a processing region (operation 210). The tungsten oxide may alternatively be formed after delivering the substrate to the processing region. In either case, the tungsten oxide may be formed by treating exposed portions of tungsten to a reactive oxygen source.

Flows of nitrogen trifluoride and ammonia ($NH_3$) are introduced into the remote plasma region (operation 220). Again, other sources of fluorine may be used to augment or replace the nitrogen trifluoride. In general, the fluorine-containing precursor may comprises at least one precursor selected from the group consisting of atomic fluorine, diatomic fluorine, bromine trifluoride, chlorine trifluoride, nitrogen trifluoride, hydrogen fluoride, sulfur hexafluoride and xenon difluoride. The flow rate of the ammonia may be less than the flow rate of the nitrogen trifluoride (e.g. between 75% and 92% of the nitrogen trifluoride flow rate) in order to optimize the removal rate of a thin layer of tungsten oxide having a higher oxygen proportion than underlying "bulk" tungsten oxide. The thin tungsten oxide layer has a W:O atomic ratio of roughly 1:3 which benefits from a slightly lower ammonia:$NF_3$ ratio. For comparison, the bulk tungsten oxide ratio has a W:O atomic ratio of roughly 1:2.

The plasma effluents formed in the remote plasma region are then flowed into the substrate processing region (operation 225). Tungsten oxide on the substrate is selectively etched (operation 230) such that thin tungsten oxide (e.g. $WO_3$) may be removed more rapidly than a variety of other materials. This process may be referred to as tungsten oxide "break-through" herein. The selective etch of the $WO_3$ layer (as well as the bulk $WO_2$ layer etched later in etch process 200) may etch tungsten oxide significantly faster than one or more of tungsten, silicon oxide, silicon nitride, and titanium nitride according to embodiments. Exemplary selectivity ranges were given previously in the first example.

The flow rate of the ammonia is increased in operation 233. The increased flow rate of ammonia while the nitrogen trifluoride flow rate is held roughly constant tailors the process for the removal of bulk tungsten oxide (e.g. $WO_2$). The increase in flow rate of the ammonia maintains the selectivities, described earlier, of the tungsten oxide relative to the other materials which may be present on the patterned substrate. In general, the flow rate ratio of the ammonia to nitrogen trifluoride is increased. For example, the flow rate of the nitrogen trifluoride may be reduced to achieve the same beneficial transition from etching the thin outer tungsten oxide layer (e.g. $WO_3$) to etching the bulk tungsten oxide layer (e.g. $WO_2$). For example, the flow rate of the ammonia may be between about 83% and 90% of the nitrogen trifluoride during removal of the $WO_3$ layer. In contrast, the flow rate of the ammonia may be between about 90% and 97% of the nitrogen trifluoride during removal of the bulk $WO_2$ layer. The flow rate ratio ($NH_3$:$NF_3$) may be increased by at least 1%, 2%, 3% or preferably 5% from operation 220 to after operation 233. Increasing the flow rate ratio may occur essentially in a single discrete step according to embodiments. The bulk tungsten oxide is etched in operation 235.

Following removal of tungsten oxide, the reactive chemical species and any process effluents are removed from the substrate processing region and then the substrate is removed from the processing region (operation 245). The etch selectivity ratios for the process just discussed with reference to FIG. 2 contain the same embodiments recited above with reference to FIG. 1.

In embodiments, the fluorine-containing gas (e.g. $NF_3$) is supplied at a flow rate of between about 25 sccm (standard cubic centimeters per minute) and 400 sccm, $NH_3$ at a flow rate of between about 20 sccm and 350 sccm, He at a flow rate of between about 0 slm (standard liters per minute) and 3 slm, and Ar at a flow rate of between about 0 slm and 3 slm. Generally speaking, the fluorine-containing precursor may be supplied at a flow rate between about 25 sccm and about 400 sccm, between about 50 sccm and about 300 sccm, between about 75 sccm and about 200 sccm or preferably between about 125 sccm and about 175 sccm according to embodiments. During operation 220, ammonia ($NH_3$) may be supplied at a flow rate between about 20 sccm and about 300 sccm, between about 30 sccm and about 250 sccm, between about 50 sccm and about 175 sccm or preferably between about 125 sccm and about 135 sccm in embodiments. Following operation 233, ammonia ($NH_3$) may be supplied at a flow rate between about 30 sccm and about 350 sccm, between about 50 sccm and about 300 sccm, between about 75 sccm and about 200 sccm or preferably between about 135 sccm and about 145 sccm in embodiments.

As indicated previously, the remote plasma source power may be applied capacitively and may be between about 10 watts and about 2500 watts, between about 30 watts and about 2000 watts, between about 100 watts and about 1500 watts, between about 300 watts and about 1000 watts or preferably between about 400 watts and 800 watts. The pressure in the substrate processing region and/or the remote plasma region may be between about 0.1 Torr and about 50 Torr, between about 0.5 Torr and about 20 Torr or preferably between about 1 Torr and about 10 Torr in embodiments. The pressure may be between about 5 Torr and about 10 Torr in a preferred embodiment. The temperature of the substrate may be between about 30° C. and about 300° C., between about 40° C. and about 250° C., between about 60° C. and about 180° C., between about 80° C. and about 150° C. or preferably between about 100° C. and about 160° C. in embodiments.

In embodiments, an ion suppressor as described in the exemplary equipment section may be used to provide radical and/or neutral species for selectively etching substrates. The ion suppressor may also be referred to as an ion suppression element. In embodiments, for example, the ion suppressor is used to filter fluorine and hydrogen containing plasma effluents to selectively etch tungsten oxide. The ion suppressor may be included in each exemplary process described herein. Using the plasma effluents, an etch rate selectivity of tungsten oxide to a wide variety of materials may be achieved.

The ion suppressor may be used to provide a reactive gas having a higher concentration of radicals than ions. The ion suppressor functions to dramatically reduce or substantially eliminate ionically charged species traveling from the plasma generation region to the substrate. The electron temperature may be measured using a Langmuir probe in the substrate processing region during excitation of a plasma in the remote plasma region on the other side of the ion suppressor. In embodiments, the electron temperature may be less than 0.5 eV, less than 0.45 eV, less than 0.4 eV, or preferably less than 0.35 eV. These extremely low values for the electron temperature are enabled by the presence of the showerhead and/or the ion suppressor positioned between the substrate processing region and the remote plasma region. Uncharged neutral and radical species may pass through the openings in the ion suppressor to react at the substrate. Because most of the charged particles of a plasma are filtered or removed by the ion suppressor, the substrate is not necessarily biased during the etch process. Such a process using radicals and other neutral species can reduce plasma damage compared to conventional plasma etch processes that include sputtering and bombardment. The ion suppressor helps control the concentration of ionic species in the reaction region at a level that assists the process. Embodiments of the present invention are also advantageous over conventional wet etch processes where surface tension of liquids can cause bending and peeling of small features.

Generally speaking, the processes described herein may be used to etch films which contain tungsten and oxygen (and not just any specific example of stoichiometric tungsten oxide). The remote plasma etch processes may remove tungsten oxide which includes an atomic concentration of about 20% or more tungsten and about 60% or more oxygen according to embodiments. The tungsten oxide may consist only of tungsten and oxygen, allowing for small dopant concentrations and other undesirable or desirable minority additives. Tungsten oxide may have roughly one of the following atomic ratios (W:0) in embodiments: 2:3, 1:2, 1:3, 1:4 or 2:5. The tungsten oxide may contain more than 25% or 30% tungsten and may contain more than 65%, 70% or 75% oxygen in embodiments. Upper limits on atomic concentration may be combined with lower limits according to embodiments.

Additional process parameters are disclosed in the course of describing an exemplary processing chamber and system.

Exemplary Processing System

Processing chambers that may implement embodiments of the present invention may be included within processing platforms such as the CENTURA® and PRODUCER® systems, available from Applied Materials, Inc. of Santa Clara, Calif.

Figure 3A:
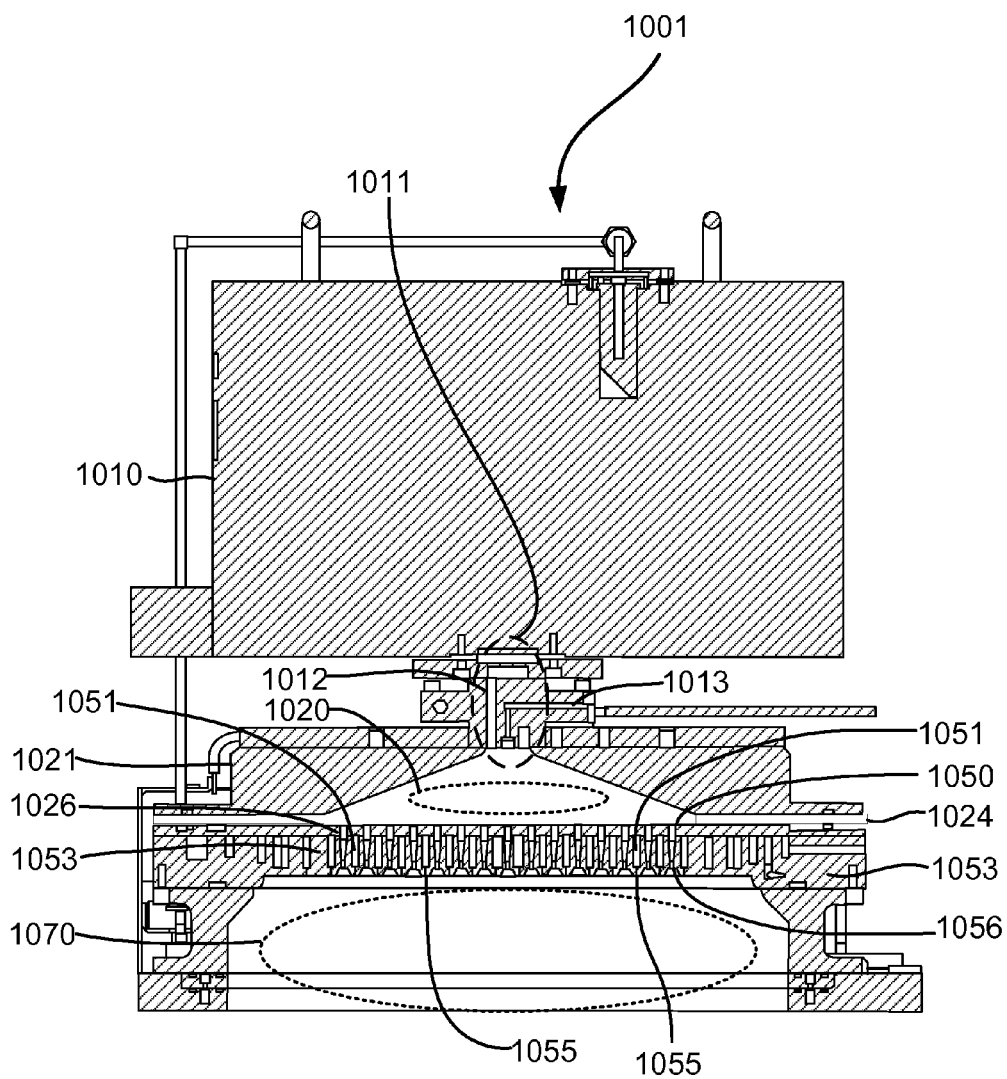
FIG. 3A shows a substrate processing chamber according to embodiments.

FIG. 3A is a substrate processing chamber 1001 according to embodiments. A remote plasma system 1010 may process a fluorine-containing precursor and/or a hydrogen-containing precursor which then travels through a gas inlet assembly 1011. Two distinct gas supply channels are visible within the gas inlet assembly 1011. A first channel 1012 carries a gas that passes through the remote plasma system 1010 (RPS), while a second channel 1013 bypasses the remote plasma system 1010. Either channel may be used for the fluorine-containing precursor, in embodiments. On the other hand, the first channel 1012 may be used for the process gas and the second channel 1013 may be used for a treatment gas. The lid (or conductive top portion) 1021 and a perforated partition 1053 are shown with an insulating ring 1024 in between, which allows an AC potential to be applied to the lid 1021 relative to perforated partition 1053. The AC potential strikes a plasma in chamber plasma region 1020. The process gas may travel through first channel 1012 into chamber plasma region 1020 and may be excited by a plasma in chamber plasma region 1020 alone or in combination with remote plasma system 1010. If the process gas (the fluorine-containing precursor) flows through second channel 1013, then only the chamber plasma region 1020 is used for excitation. The combination of chamber plasma region 1020 and/or remote plasma system 1010 may be referred to as a remote plasma system herein. The perforated partition (also referred to as a showerhead) 1053 separates chamber plasma region 1020 from a substrate processing region 1070 beneath showerhead 1053. Showerhead 1053 allows a plasma present in chamber plasma region 1020 to avoid directly exciting gases in substrate processing region 1070, while still allowing excited species to travel from chamber plasma region 1020 into substrate processing region 1070.

Showerhead 1053 is positioned between chamber plasma region 1020 and substrate processing region 1070 and allows plasma effluents (excited derivatives of precursors or other gases) created within remote plasma system 1010 and/or chamber plasma region 1020 to pass through a plurality of through-holes 1056 that traverse the thickness of the plate. The showerhead 1053 also has one or more hollow volumes 1051 which can be filled with a precursor in the form of a vapor or gas (such as a fluorine-containing precursor) and pass through small holes 1055 into substrate processing region 1070 but not directly into chamber plasma region 1020. Showerhead 1053 is thicker than the length of the smallest diameter 1050 of the through-holes 1056 in this embodiment. The length 1026 of the smallest diameter 1050 of the through-holes may be restricted by forming larger diameter portions of through-holes 1056 part way through the showerhead 1053 to maintain a significant concentration of excited species penetrating from chamber plasma region 1020 to substrate processing region 1070. The length of the smallest diameter 1050 of the through-holes 1056 may be the same order of magnitude as the smallest diameter of the through-holes 1056 or less in embodiments.

Showerhead 1053 may be configured to serve the purpose of an ion suppressor as shown in FIG. 3A. Alternatively, a separate processing chamber element may be included (not shown) which suppresses the ion concentration traveling into substrate processing region 1070. Lid 1021 and showerhead 1053 may function as a first electrode and second electrode, respectively, so that lid 1021 and showerhead 1053 may receive different electric voltages. In these configurations, electrical power (e.g., RF power) may be applied to lid 1021, showerhead 1053, or both. For example, electrical power may be applied to lid 1021 while showerhead 1053 (serving as ion suppressor) is grounded. The substrate processing system may include a RF generator that provides electrical power to the lid and/or showerhead 1053. The voltage applied to lid 1021 may facilitate a uniform distribution of plasma (i.e., reduce localized plasma) within chamber plasma region 1020. To enable the formation of a plasma in chamber plasma region 1020, insulating ring 1024 may electrically insulate lid 1021 from showerhead 1053. Insulating ring 1024 may be made from a ceramic and may have a high breakdown voltage to avoid sparking. Portions of substrate processing chamber 1001 near the capacitively-coupled plasma components just described may further include a cooling unit (not shown) that includes one or more cooling fluid channels to cool surfaces exposed to the plasma with a circulating coolant (e.g., water).

In the embodiment shown, showerhead 1053 may distribute (via through-holes 1056) process gases which contain fluorine, hydrogen and/or plasma effluents of such process gases upon excitation by a plasma in chamber plasma region 1020. In embodiments, the process gas introduced into the remote plasma system 1010 and/or chamber plasma region 1020 may contain fluorine (e.g. $F_2$, $NF_3$ or $XeF_2$). The process gas may also include a carrier gas such as helium, argon, nitrogen ($N_2$), etc. Plasma effluents may include ionized or neutral derivatives of the process gas and may also be referred to herein as radical-fluorine and/or radical-hydrogen referring to the atomic constituent of the process gas introduced.

Through-holes 1056 are configured to suppress the migration of ionically-charged species out of the chamber plasma region 1020 while allowing uncharged neutral or radical species to pass through showerhead 1053 into substrate processing region 1070. These uncharged species may include highly reactive species that are transported with less-reactive carrier gas by through-holes 1056. As noted above, the migration of ionic species by through-holes 1056 may be reduced, and in some instances completely suppressed. Controlling the amount of ionic species passing through showerhead 1053 provides increased control over the gas mixture brought into contact with the underlying wafer substrate, which in turn increases control of the deposition and/or etch characteristics of the gas mixture. For example, adjustments in the ion concentration of the gas mixture can alter the etch selectivity (e.g., the tungsten oxide:tungsten etch ratio).

In embodiments, the number of through-holes 1056 may be between about 60 and about 2000. Through-holes 1056 may have a variety of shapes but are most easily made round. The smallest diameter 1050 of through-holes 1056 may be between about 0.5 mm and about 20 mm or between about 1 mm and about 6 mm in embodiments. There is also latitude in choosing the cross-sectional shape of through-holes, which may be made conical, cylindrical or combinations of the two shapes. The number of small holes 1055 used to introduce unexcited precursors into substrate processing region 1070 may be between about 100 and about 5000 or between about 500 and about 2000 in different embodiments. The diameter of the small holes 1055 may be between about 0.1 mm and about 2 mm.

Through-holes 1056 may be configured to control the passage of the plasma-activated gas (i.e., the ionic, radical, and/or neutral species) through showerhead 1053. For example, the aspect ratio of the holes (i.e., the hole diameter to length) and/or the geometry of the holes may be controlled so that the flow of ionically-charged species in the activated gas passing through showerhead 1053 is reduced. Through-holes 1056 in showerhead 1053 may include a tapered portion that faces chamber plasma region 1020, and a cylindrical portion that faces substrate processing region 1070. The cylindrical portion may be proportioned and dimensioned to control the flow of ionic species passing into substrate processing region 1070. An adjustable electrical bias may also be applied to showerhead 1053 as an additional means to control the flow of ionic species through showerhead 1053.

Alternatively, through-holes 1056 may have a smaller inner diameter (ID) toward the top surface of showerhead 1053 and a larger ID toward the bottom surface. In addition, the bottom edge of through-holes 1056 may be chamfered to help evenly distribute the plasma effluents in substrate processing region 1070 as the plasma effluents exit the showerhead and promote even distribution of the plasma effluents and precursor gases. The smaller ID may be placed at a variety of locations along through-holes 1056 and still allow showerhead 1053 to reduce the ion density within substrate processing region 1070. The reduction in ion density results from an increase in the number of collisions with walls prior to entry into substrate processing region 1070. Each collision increases the probability that an ion is neutralized by the acquisition or loss of an electron from the wall. Generally speaking, the smaller ID of through-holes 1056 may be between about 0.2 mm and about 20 mm. In other embodiments, the smaller ID may be between about 1 mm and 6 mm or between about 0.2 mm and about 5 mm. Further, aspect ratios of the through-holes 1056 (i.e., the smaller ID to hole length) may be approximately 1 to 20. The smaller ID of the through-holes may be the minimum ID found along the length of the through-holes. The cross sectional shape of through-holes 1056 may be generally cylindrical, conical, or any combination thereof.

Figure 3B:
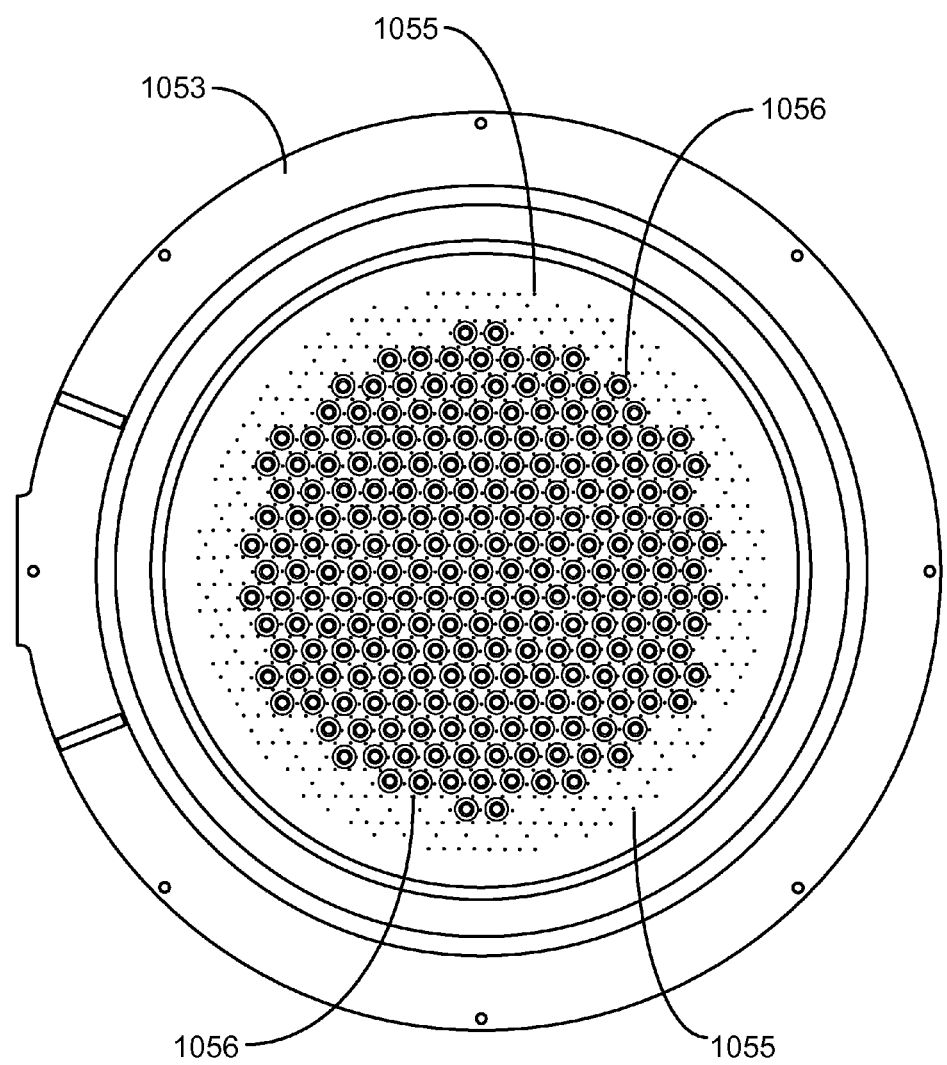
FIG. 3B shows a showerhead of a substrate processing chamber according to embodiments.

FIG. 3B is a bottom view of a showerhead 1053 for use with a processing chamber according to embodiments. Showerhead 1053 corresponds with the showerhead shown in FIG. 3A. Through-holes 1056 are depicted with a larger inner-diameter (ID) on the bottom of showerhead 1053 and a smaller ID at the top. Small holes 1055 are distributed substantially evenly over the surface of the showerhead, even amongst the through-holes 1056 which helps to provide more even mixing than other embodiments described herein.

An exemplary patterned substrate may be supported by a pedestal (not shown) within substrate processing region 1070 when fluorine-containing plasma effluents and hydrogen-containing plasma effluents arrive through through-holes 1056 in showerhead 1053. Though substrate processing region 1070 may be equipped to support a plasma for other processes such as curing, no plasma is present during the etching of patterned substrate according to embodiments.

A plasma may be ignited either in chamber plasma region 1020 above showerhead 1053 or substrate processing region 1070 below showerhead 1053. A plasma is present in chamber plasma region 1020 to produce the radical-fluorine from an inflow of the fluorine-containing precursor. An AC voltage typically in the radio frequency (RF) range is applied between the conductive top portion (lid 1021) of the processing chamber and showerhead 1053 to ignite a plasma in chamber plasma region 1020 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 1070 is turned on to either cure a film or clean the interior surfaces bordering substrate processing region 1070. A plasma in substrate processing region 1070 is ignited by applying an AC voltage between showerhead 1053 and the pedestal or bottom of the chamber. A cleaning gas may be introduced into substrate processing region 1070 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The chamber plasma region or a region in a remote plasma system may be referred to as a remote plasma region. In embodiments, the radical precursors (e.g. radical-fluorine and/or radical-hydrogen) are formed in the remote plasma region and travel into the substrate processing region where the combination preferentially etches tungsten oxide. Plasma power may essentially be applied only to the remote plasma region, in embodiments, to ensure that the radical-fluorine and/or the radical-hydrogen (which together may be referred to as plasma effluents) are not further excited in the substrate processing region.

In embodiments employing a chamber plasma region, the excited plasma effluents are generated in a section of the substrate processing chamber partitioned from the substrate processing region. The substrate processing region, is where the plasma effluents mix and react to etch the patterned substrate (e.g., a semiconductor wafer). The excited plasma effluents may also be accompanied by inert gases (in the exemplary case, argon). The substrate processing region may be described herein as "plasma-free" during etching of the substrate. "Plasma-free" does not necessarily mean the region is devoid of plasma. A relatively low concentration of ionized species and free electrons created within the plasma region do travel through pores (apertures) in the partition (showerhead/ion suppressor) due to the shapes and sizes of through-holes 1056. In some embodiments, there is essentially no concentration of ionized species and free electrons within the substrate processing region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

Nitrogen trifluoride (or another fluorine-containing precursor) may be flowed into chamber plasma region 1020 at rates between about 5 sccm and about 500 sccm, between about 10 sccm and about 300 sccm, between about 25 sccm and about 200 sccm, between about 50 sccm and about 150 sccm or between about 75 sccm and about 125 sccm in embodiments. Ammonia ($NH_3$) may be flowed into chamber plasma region 1020 at rates greater than or about 50 sccm, greater than or about 100 sccm, greater than or about 200 sccm, or greater than or about 500 sccm according to embodiments.

Combined flow rates of fluorine-containing precursor and hydrogen-containing precursor (ammonia) into the chamber may account for 0.05% to about 20% by volume of the overall gas mixture; the remainder being carrier gases. The fluorine-containing precursor and the hydrogen-containing precursor are flowed into the remote plasma region but the plasma effluents have the same volumetric flow ratio, in embodiments. In the case of the fluorine-containing precursor, a purge or carrier gas may be first initiated into the remote plasma region before those of the fluorine-containing gas to stabilize the pressure within the remote plasma region.

Plasma power applied to the remote plasma region can be a variety of frequencies or a combination of multiple frequencies. In the exemplary processing system the plasma is provided by RF power delivered between lid 1021 and showerhead 1053. In an embodiment, the energy is applied using a capacitively-coupled plasma unit. When using a Frontier™ or similar system, the remote plasma source power may be between about 100 watts and about 3000 watts, between about 200 watts and about 2500 watts, between about 300 watts and about 2000 watts, or between about 500 watts and about 1500 watts in embodiments. The RF frequency applied in the exemplary processing system may be low RF frequencies less than about 200 kHz, high RF frequencies between about 10 MHz and about 15 MHz or microwave frequencies greater than or about 1 GHz according to embodiments.

Substrate processing region 1070 can be maintained at a variety of pressures during the flow of carrier gases and plasma effluents into substrate processing region 1070. The pressure within the substrate processing region is below or about 50 Torr, below or about 30 Torr, below or about 20 Torr, below or about 10 Torr or below or about 5 Torr in embodiments. The pressure may be above or about 0.1 Torr, above or about 0.2 Torr, above or about 0.5 Torr or above or about 1 Torr according to embodiments. Lower limits on the pressure may be combined with upper limits on the pressure in embodiments.

In one or more embodiments, the substrate processing chamber 1001 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum. Processing chambers that may implement embodiments of the present invention may include dielectric etch chambers or a variety of chemical vapor deposition chambers, among other types of chambers.

Figure 4:
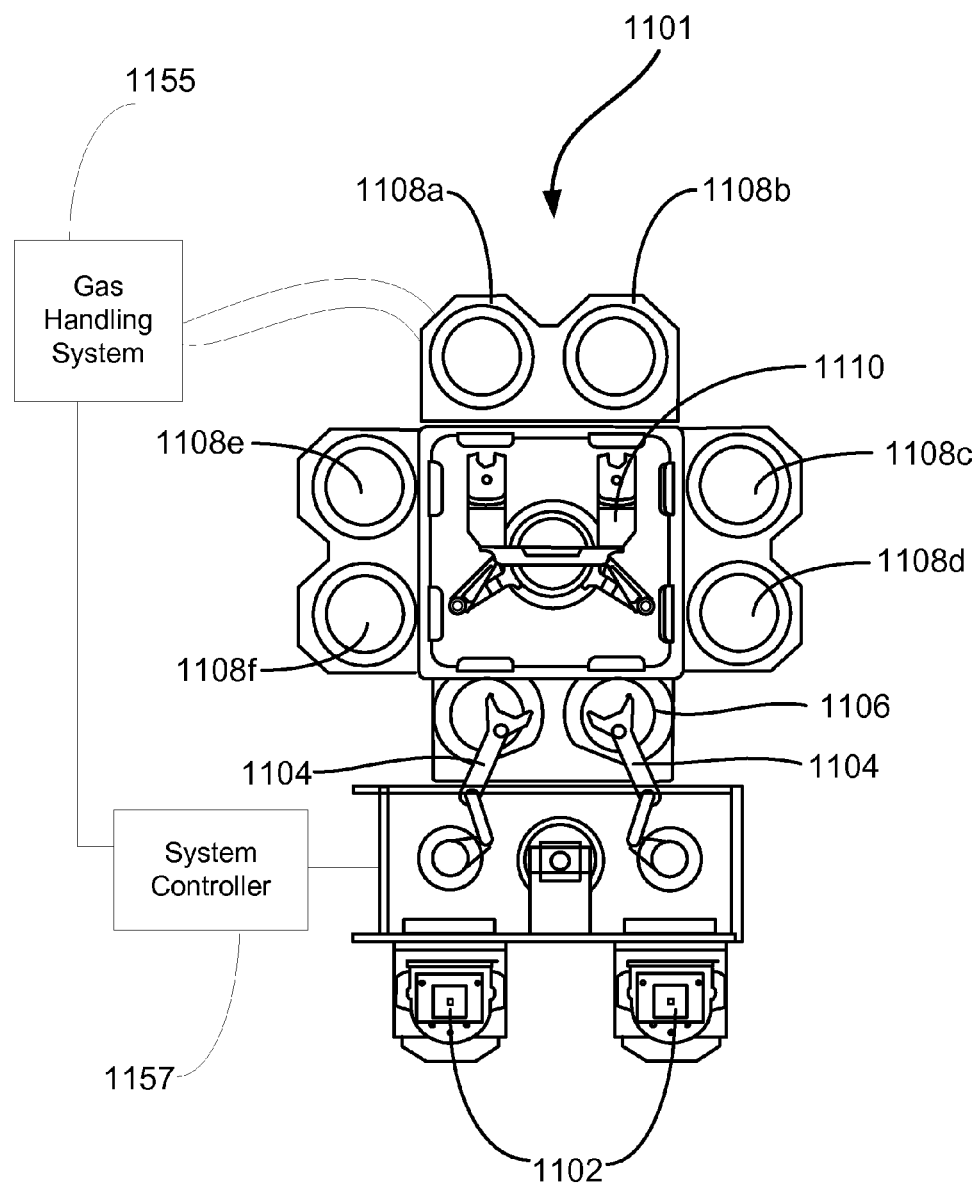
FIG. 4 shows a substrate processing system according to embodiments.

Embodiments of the deposition systems may be incorporated into larger fabrication systems for producing integrated circuit chips. FIG. 4 shows one such system 1101 of deposition, baking and curing chambers according to embodiments. In the figure, a pair of FOUPs (front opening unified pods) 1102 supply substrate substrates (e.g., 300 mm diameter wafers) that are received by robotic arms 1104 and placed into a low pressure holding areas 1106 before being placed into one of the wafer processing chambers 1108a-f. A second robotic arm 1110 may be used to transport the substrate wafers from the low pressure holding areas 1106 to the wafer processing chambers 1108a-f and back. Each wafer processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The wafer processing chambers 1108a-f may include one or more system components for depositing, annealing, curing and/or etching a flowable dielectric film on the substrate wafer. In one configuration, two pairs of the processing chamber (e.g., 1108c-d and 1108e-f) may be used to deposit dielectric material on the substrate, and the third pair of processing chambers (e.g., 1108a-b) may be used to etch the deposited dielectric. In another configuration, all three pairs of chambers (e.g., 1108a-f) may be configured to etch a dielectric film on the substrate. Any one or more of the processes described may be carried out on chamber(s) separated from the fabrication system shown in embodiments.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

System controller 1157 is used to control motors, valves, flow controllers, power supplies and other functions required to carry out process recipes described herein. A gas handling system 1155 may also be controlled by system controller 1157 to introduce gases to one or all of the wafer processing chambers 1108a-f. System controller 1157 may rely on feedback from optical sensors to determine and adjust the position of movable mechanical assemblies in gas handling system 1155 and/or in wafer processing chambers 1108a-f. Mechanical assemblies may include the robot, throttle valves and susceptors which are moved by motors under the control of system controller 1157.

In an exemplary embodiment, system controller 1157 includes a hard disk drive (memory), USB ports, a floppy disk drive and a processor. System controller 1157 includes analog and digital input/output boards, interface boards and stepper motor controller boards. Various parts of multi-chamber processing system 1101 which contains substrate processing chamber 1001 are controlled by system controller 1157. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon nitride" of the patterned substrate is predominantly $Si_3N_4$ but may include minority concentrations of other elemental constituents (e.g. oxygen, hydrogen, carbon). Exposed "silicon oxide" of the patterned substrate is predominantly $SiO_2$ but may include minority concentrations of other elemental constituents (e.g. nitrogen, hydrogen, carbon). In some embodiments, silicon oxide films etched using the methods described herein consist essentially of silicon and oxygen. "Tungsten oxide" is predominantly tungsten and oxygen but may include minority concentrations of other elemental constituents (e.g. nitrogen, hydrogen, carbon). Tungsten oxide may consist of tungsten and oxygen. "Titanium nitride" is predominantly titanium and nitrogen but may include minority concentrations of other elemental constituents (e.g. nitrogen, hydrogen, carbon). Titanium nitride may consist of titanium and nitrogen.

The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. "Radical-fluorine" (or "radical-hydrogen") are radical precursors which contain fluorine (or hydrogen) but may contain other elemental constituents. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching tungsten oxide, the method comprising:
    flowing a fluorine-containing precursor and ammonia ($NH_3$) into a remote plasma region fluidly coupled to a substrate processing region via through-holes in a showerhead while forming a remote plasma in the remote plasma region to produce plasma effluents; and
    etching the tungsten oxide from a substrate disposed within the substrate processing region by flowing the plasma effluents into the substrate processing region through the through-holes in the showerhead.

2. The method of claim 1 wherein the tungsten oxide comprises about 20% or more tungsten and about 60% or more oxygen.

3. The method of claim 1 wherein a flow rate of the ammonia ($NH_3$) is between about 75% and about 100% of the flow rate of the fluorine-containing precursor.

4. The method of claim 1 wherein the substrate is a patterned substrate which further comprises one or more exposed regions of tungsten, silicon nitride, silicon oxide or titanium nitride.

5. The method of claim 4 wherein the operation of etching the tungsten oxide comprises etching tungsten oxide faster than tungsten by a ratio of about 10:1 or more, faster than silicon nitride by a ratio of about 20:1 or more, faster than silicon oxide by a ratio of about 15:1 or more or faster than titanium nitride by a ratio of about 20:1 or more.

6. The method of claim 1 wherein a temperature of the substrate is greater than or about 30° C. and less than or about 300° C. during the etching operation.

7. A method of etching tungsten oxide, the method comprising:
    flowing a fluorine-containing precursor and ammonia ($NH_3$) into a remote plasma region fluidly coupled to a substrate processing region via through-holes in a showerhead, wherein the fluorine-containing precursor and the ammonia are flowed at a first flow rate ratio (ammonia:fluorine-containing precursor);
    forming a remote plasma in the remote plasma region to produce plasma effluents from the fluorine-containing precursor and the ammonia ($NH_3$);
    etching a first portion of the tungsten oxide from a substrate disposed within the substrate processing region by flowing the plasma effluents into the substrate processing region through the through-holes in the showerhead;
    increasing flow rate ratio (ammonia:fluorine-containing precursor) to a second flow rate ratio which is greater than the first flow rate ratio;
    etching a second portion of the tungsten oxide from the substrate by continuing to flow plasma effluents into the substrate processing region.

8. The method of claim 7 wherein the first portion of the tungsten oxide has a W:O atomic ratio of roughly 1:3.

9. The method of claim 7 wherein the second portion of the tungsten oxide has a W:O atomic ratio of roughly 1:2.

10. The method of claim 7 wherein the second flow rate ratio exceeds the first flow rate ratio by at least 1%.

11. The method of claim 7 wherein the operation of increasing flow rate ratio comprises changing from the first flow rate ratio to the second flow rate ratio essentially in a single discrete step.

12. A method of etching tungsten oxide, the method comprising:
flowing nitrogen trifluoride ($NF_3$) at a nitrogen trifluoride flow rate and ammonia ($NH_3$) at a first ammonia flow rate into a remote plasma region fluidly coupled to a substrate processing region via through-holes in a showerhead;
forming a remote plasma in the remote plasma region to produce plasma effluents from the nitrogen trifluoride and the ammonia;
etching a first portion of the tungsten oxide from a substrate disposed within the substrate processing region by flowing the plasma effluents into the substrate processing region through the through-holes in the showerhead;
increasing the flow rate of the ammonia from the first ammonia flow rate to a second ammonia flow rate;
etching a second portion of the tungsten oxide from the substrate by continuing to flow plasma effluents into the substrate processing region.

13. The method of claim 12 wherein the first ammonia flow rate is between 75% and 92% of the nitrogen trifluoride flow rate.

14. The method of claim 12 wherein the second ammonia flow rate is between 90% and 97% of the nitrogen trifluoride flow rate.

15. The method of claim 12 wherein forming the remote plasma in the remote plasma region to produce plasma effluents comprises applying RF power between about 10 watts and about 2500 watts to the remote plasma region.

* * * * *